United States Patent [19]
Joiner, Jr.

[11] Patent Number: 5,483,098
[45] Date of Patent: Jan. 9, 1996

[54] DROP-IN HEAT SINK PACKAGE WITH WINDOW FRAME FLAG

[75] Inventor: Bennett A. Joiner, Jr., Austin, Tex.

[73] Assignee: Motorola, Inc., Schaumburg, Ill.

[21] Appl. No.: 326,160

[22] Filed: Oct. 18, 1994

Related U.S. Application Data

[63] Continuation of Ser. No. 871,776, Apr. 21, 1992, abandoned.

[51] Int. Cl.$^6$ .................................................. H01L 23/495
[52] U.S. Cl. ........................... 257/676; 257/719; 257/796
[58] Field of Search ................................... 257/684, 676, 257/796, 719; 437/220, 211, 207, 206

[56] References Cited

U.S. PATENT DOCUMENTS

| | | | |
|---|---|---|---|
| 4,777,520 | 10/1988 | Nambu et al. | 257/667 |
| 4,924,291 | 5/1990 | Lesk et al. | 357/70 |
| 5,068,712 | 11/1991 | Murakami et al. | 357/72 |
| 5,073,817 | 12/1991 | Veda | 257/787 |
| 5,155,661 | 10/1992 | Nagesh et al. | 257/687 |
| 5,172,213 | 12/1992 | Zimmerman | 257/796 |
| 5,177,669 | 1/1993 | Juskey et al. | 257/675 |
| 5,216,283 | 6/1993 | Lin | 257/787 |

FOREIGN PATENT DOCUMENTS

| | | |
|---|---|---|
| 433695A2 | 6/1991 | European Pat. Off. . |
| 107063 | 7/1982 | Japan . |
| 57-107063 | 7/1982 | Japan ............................ H01L 23/40 |
| 1136356 | 5/1989 | Japan . |
| 1209751 | 8/1989 | Japan .................................... 257/676 |
| 1293551 | 11/1989 | Japan . |
| 1-293551 | 11/1989 | Japan ............................ H01L 23/50 |
| 3178153 | 8/1991 | Japan .................................... 257/676 |
| 4-06860 | 1/1992 | Japan . |
| 4-51549 | 2/1992 | Japan . |
| 9010731 | 9/1990 | WIPO . |

Primary Examiner—Rolf Hille
Assistant Examiner—Roy Potter
Attorney, Agent, or Firm—Minh-Hien N. Clark

[57] ABSTRACT

A molded semiconductor device (24) having greater resistance to package cracking during board mounting in addition to increased thermal performance is provided wherein the device has a reduced semiconductor die to flag interface and a drop-in heat sink. The semiconductor die (12) is mounted on a leadframe (16) having a flag (15) with an opening to expose a substantial portion of the inactive surface (14) of the die (12). Decreasing the interfacial contact area between the die (12) and the flag (15) reduces the risk of package cracking during board mounting by limiting the area where delamination typically occurs. An encapsulant (22) forms a package body which encompasses an opening (23) to expose a substantial portion of the inactive surface (14) of the semiconductor die (12). A heat sink (26) is inserted into the opening (23), directly coupling the heat sink (26) to the die (12), after the semiconductor package is mounted onto a printed circuit board.

20 Claims, 2 Drawing Sheets

DROP-IN HEAT SINK PACKAGE WITH WINDOW FRAME FLAG

This application is a continuation of prior application Ser. No. 07/871,776, filed Apr. 21, 1992 now abandoned.

CROSS-REFERENCE TO RELATED APPLICATION

Related subject matter is disclosed in U.S. Patent application by Paul T. Lin, entitled "Semiconductor Device Having an Insertable Heat Sink and Method for Mounting the Same," Ser. No. 07/519,375, filed Apr. 30, 1990, and assigned to the assignee hereof.

1. Field of the Invention

The present invention relates to semiconductor devices in general, and more specifically to semiconductor devices having packages exposing bare silicon and including thermal dissipation structures.

2. Background of the Invention

Molded semiconductor packages generally comprise a semiconductor die mounted on the flag of a metal leadframe wherein the semiconductor die is electrically connected to the leads of the metal leadframe by wire bonds. The semiconductor die, the wire bonds, and the leadframe, excepting the distal ends of the leads, are then encapsulated in plastic. Several problems are inherent with this type of package. These problems include the package having many material interfaces and being relatively susceptible to package cracking during vapor phase or solder dip.

A prominent test for molded semiconductor packages is to saturate them with moisture or water vapor followed by immersion, within a short period of time, in either a solvent vapor or a liquid solder at or above the soldering temperature. Water absorption in some currently used plastic molded packages has been measured by a weight gain of 0.4%. This water will vaporize upon sudden heating, resulting in a rapid increase of vapor pressure. This sudden increase of internal vapor pressure results in packages that may crack. This test is particularly destructive if there is condensed water in package voids that generally occur at material interfaces. Even if the molding is perfect, voids may still be produced as a result of mechanical stresses in the package due to thermal expansion differences between the molding compound, mounting flag, and silicon die.

Cracks in the molding compound have occurred at die and flag corners while separations have occurred between the die and flag, and the flag and molding compound. It is also common for voids to occur at the die bond areas. Cracks and separations in molded semiconductor packages are especially detrimental in that they cause damage to the wire bonds as well as to the die. It is common for large amounts of stress to act upon the semiconductor die, especially at the sides and corners as a crack propagates throughout the plastic molding compound. Therefore, it would be desirable to have a molded semiconductor package that inhibits crack propagation. Furthermore, a minimum number of material interfaces to reduce the number of voids contained therein is also advantageous.

Another problem commonly encountered with the use of molded semiconductor packages is that of heat dissipation. Heat trapped within the plastic package body can cause temperature cycling damage due to the thermal expansion coefficient mismatch of the various materials as well as inhibiting device performance. A heat sink provides an improved thermal path for heat dissipation. One method of incorporating a heat sink into a molded semiconductor package is to directly mount the semiconductor die to a heat sink. The assembly is then mounted to a metal leadframe where the flag of the leadframe has an opening sized so that the heat sink can fit through. The semiconductor die can then be wire bonded to the leads of the leadframe in a normal manner. An encapsulant is molded around the entire die, heat sink, and leadframe assembly, where the bottom of the heat sink is not encapsulated by the encapsulant but is on the same plane as the bottom of the package body as formed by the encapsulant. The major drawback to this approach is that it precludes any flexibility in varying the heat sink for specific user requirements after the assembly process, since the heat sink is molded into the semiconductor package.

SUMMARY OF THE INVENTION

In accordance with the invention, there is provided a semiconductor device having a semiconductor die, a leadframe, a plurality of conductive wires, and an encapsulant. The semiconductor die has an active surface, an inactive surface, a periphery, and a plurality of bonding pads on the active surface. The leadframe has a plurality of leads and a mounting surface having a die opening that is smaller than the semiconductor die. A first portion of the inactive surface of the semiconductor die is bonded to the mounting surface of the leadframe above the die opening thereby exposing a second portion of the inactive surface of the semiconductor die. The plurality of conductive wires electrically couple the plurality of bonding pads on the active surface of the semiconductor die to the plurality of leads of the leadframe. The encapsulant forms a package body around the periphery, over the active surface, and over the first portion of the inactive surface of the semiconductor die, the wires, and the leadflame, wherein the package body encompasses an opening exposing the second portion of the inactive surface of the semiconductor die. These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF THE PREFERRED EMBODIMENT

With the present invention, it is possible to meet the previously stated desired features of inhibiting crack propagation in a molded plastic semiconductor package, reducing the number of material interfaces, and providing a good thermal path for heat dissipation. The invention enables a molded plastic semiconductor device with a reduced semiconductor die to flag material interface and an insertable heat sink. Moreover, the invention provides a method for making the same.

Figure 1:
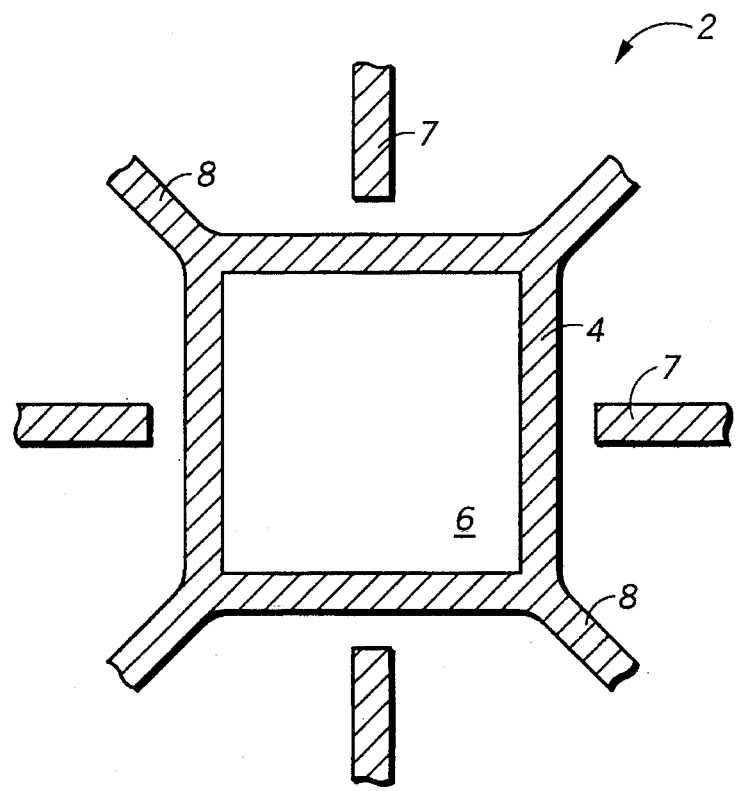
FIG. 1 is a top view of a leadframe having a mounting surface with a die opening, otherwise referred to as window frame flag.

A top view of a leadframe 2, an element of the present invention, is illustrated in FIG. 1. Leadframe 2 has a mounting surface 4 that has a die opening 6. This mounting surface configuration is typically referred to as a window frame flag. Leadframe 2 also has a plurality of leads 7 for making electrical connections to a semiconductor die (not shown) and a plurality of tie bars 8 for supporting the mounting surface 4.

Figure 2:
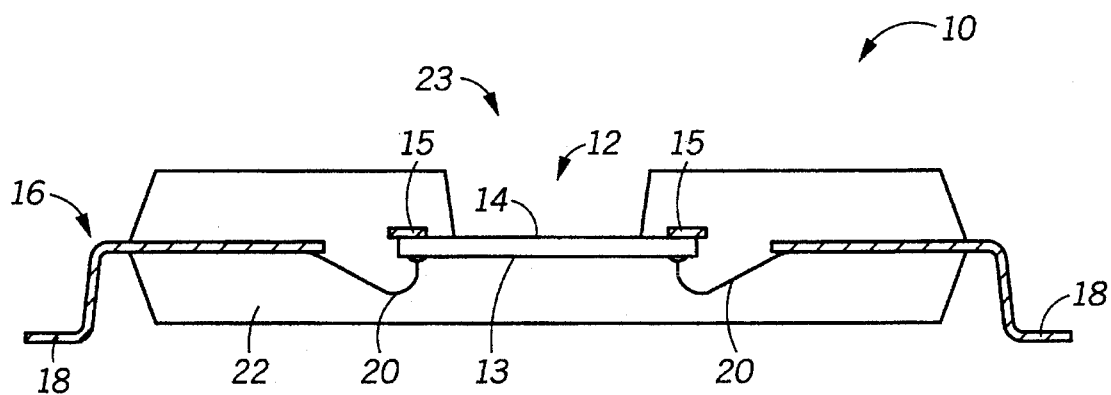
FIG. 2 is a cross-sectional view of a molded plastic semiconductor device with an opening in the package body for inserting a thermally conductive heat spreader and coupling it directly to a semiconductor die, wherein the semiconductor die is mounted onto a flag with a die opening.

A finished semiconductor device 10, in accordance with the invention, is illustrated in FIG. 2. A semiconductor die 12, having an active surface 13 and an inactive surface 14, is attached to a mounting surface 15 of a leadframe 16, typically by use of a conductive adhesive material such as a conductivefilled epoxy. Mounting surface 15 has a die opening smaller than semiconductor die 12, mounting surface 15 otherwise referred to as a window frame flag, such that the only semiconductor die 12 to mounting surface 15 interface is around the periphery of the inactive surface 14 of semiconductor die 12. Leadflame 16 is also made of a thermally conductive material such as copper, a copper alloy, an iron-nickel alloy, or other metals. Leadframe 16 can have a surface treatment, such as plating, an organic coating, oxidation, or UV ozone cleaning. Leadframe surface treatments may promote adhesion between a leadframe and a molding compound. Leadframe 16 has a plurality of leads 18 which each have ends proximal and distal to semiconductor die 12. The leads are electrically coupled to the die. As illustrated, wire bonds 20 are used to couple proximal ends of leads 18 to bonding pads (not shown) on the active surface 13 of semiconductor die 12. Wire bonds 20 are of a conductive material such as gold, copper, aluminum, or alloys of these materials.

As illustrated in FIG. 2, the active surface 13 of semiconductor die 12, the proximal ends of the leads 18, the wire bonds 20, the mounting surface 15, and portions of the inactive surface 14 of semiconductor die 12 are encapsulated by an encapsulating material 22. The encapsulating material 22 is typically a thermosetting plastic, for example a phenolic epoxy, an epoxy novolac resin, or other molding compound resin. As shown in FIG. 2, encapsulant 22 does not completely encapsulate inactive surface 14 of semiconductor die 12, but rather encompasses an opening 23 in the package body to expose a portion of the inactive surface 14, wherein opening 23 can be formed by adding a boss or a pedestal to the mold tool. This structure has several advantages. The material interface between the semiconductor die and the flag is reduced to contact only around the periphery of the die. It is typical for delamination or separation to occur at this interface when the semiconductor device is subjected to stress. Moisture can accumulate in this delaminated region which can affect the package's "popcorn performance." Any moisture inside the package will vaporize upon the rapid heating associated with the vapor phase or solder reflow operation, resulting in a rapid increase of vapor pressure. This sudden increase of internal vapor pressure results in packages that may crack. By mounting the semiconductor die on a flag with a die opening, there is less surface area where the delamination can occur. Furthermore, the die opening acts as a pressure venting path for moisture to exit the package during the vapor phase or solder reflow operation. Because the internal vapor pressure is able to be released through the opening in the package body, the plastic semiconductor package of the present invention tends not to crack or popcorn.

Figure 3:
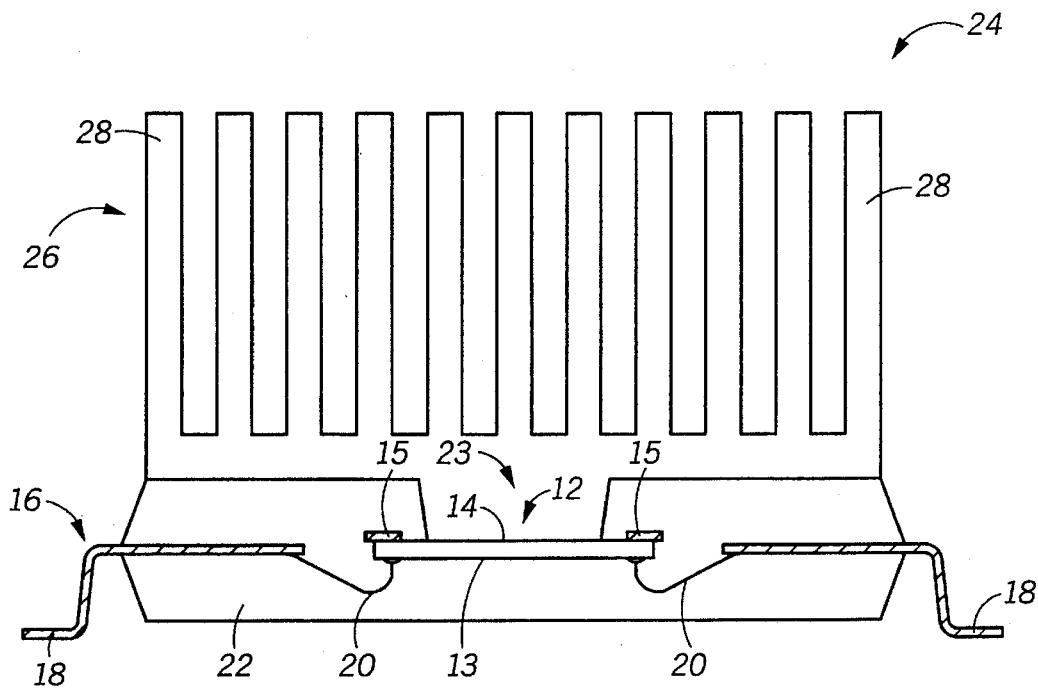
FIG. 3 is a cross-sectional view of a molded plastic semiconductor device with an inserted thermally conductive heat spreader directly attached to a semiconductor die, wherein the semiconductor die is mounted onto a flag with a die opening.

Another embodiment of the present invention is illustrated in FIG. 3. Shown is a cross-section of a semiconductor device 24 comprising substantially the same elements as the first embodiment, illustrated in FIG. 2, with an attached heat sink 26. Heat sink 26 is constructed from a material having high thermal conductivity such as a metal or a metallic composite material. Heat sink 26 is preferably constructed from an aluminum-filled polymer. Other metals having a high thermal conductivity, however, can be used such as aluminum, copper, gold, or the like and alloys thereof. Additionally, non-metallic thermally conductive materials such as fused silica, boron nitride and the like can be used as a filler material in heat sink 26. Heat sink 26 has a plurality of cooling fins 28 to increase a thermal dissipating effectiveness of heat sink. 26. Thermal resistances for a standard plastic 28 mm square package without a heat sink has been measured at 40° C./W, while the same package with a flat top surface heat sink has been measured at 32° C./W, as compared to the present invention which has been calculated to have a thermal resistance of 10° C./W. A lower thermal resistance indicates better heat dissipation. Heat sink 26 is formed into a shape compatible with the outline of package body 22 so that heat sink 26 can directly overlie package body 22, wherein a insertable portion of heat sink 26 fits into the opening 23 of the package body 22. Heat sink 26 is directly attached to the inactive surface 14 of semiconductor die 12 with a thermally conductive adhesive. Alternatively, heat sink 26 can be coupled to the inactive surface 14 of semiconductor die 12 with a thermal grease and secured in place with a clip (not shown). It is preferable to insert the heat sink 26 into opening 23 of package body 22 after the semiconductor device is already board mounted, because this allows for the popcorning advantage to be retained in addition to gaining the thermal advantage of the heat spreader. It is only necessary to have a heat sink to dissipate heat when the semiconductor device is in operation. Therefore, attaching the heat sink after mounting to the printed circuit board allows the user all the advantages of the first embodiment, shown in FIG. 2, in addition to having the heat sink for enhanced thermal dissipation. Furthermore, by inserting the heat sink at the end user's site, the user has the flexibility to choose the heat sink material and configuration that best meet his requirements. For example, the heat sink may be larger than the package body.

Figure 4:
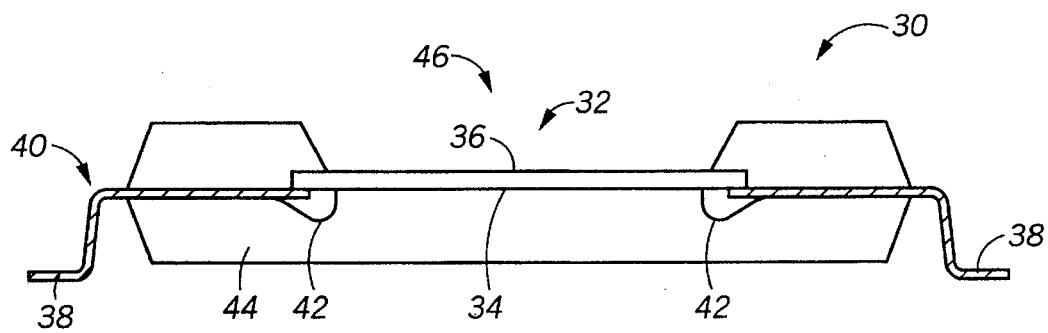
FIG. 4 is a cross-sectional view of a molded LOC (Lead on Chip) plastic semiconductor device with an opening in the package body for inserting a thermally conductive heat spreader and coupling it directly to a semiconductor die.

Another alternative to the invention is illustrated in FIG. 4 wherein many of the elements are substantially the same as the first embodiment, shown in FIG. 2. Illustrated in FIG. 4 is a cross-section of a LOC (Lead on Chip) semiconductor device 30 comprising a semiconductor die 32, having an active surface 34 and an inactive surface 36, mounted on a plurality of leads 38 of leadframe 40. Active surface 34 is attached to the plurality of leads 38 typically by double-sided polyimide tape or a thermally conductive epoxy. Wire bonds 42 are used to couple proximal ends of leads 38 to bonding pads (not shown) on the active surface 34 of semiconductor die 32. The active surface 34 of semiconductor die 32, the proximal ends of the leads 38, the wire bonds 42, and at most a portion of the inactive surface 36 of semiconductor die 32 are encapsulated by an encapsulating material 44. As illustrated in FIG. 4, encapsulant 44 does not completely encapsulate inactive surface 36 of semiconductor die 32, but rather encompasses an opening 46 in the package body to expose at least a portion of the inactive surface 36. It is possible to attach a heat sink in opening 46 to the exposed portion of inactive surface 36 of semiconductor die 32 in a manner similar to the second embodiment of the invention, shown in FIG. 3.

Figure 5:
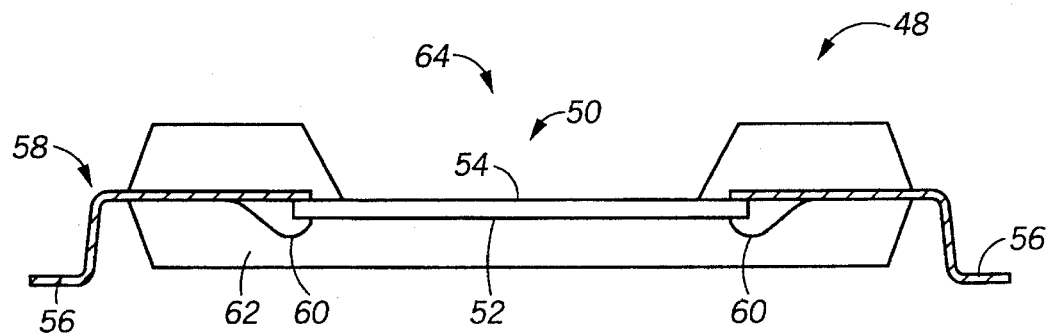
FIG. 5 is a cross-sectional view of a molded COL (Chip on Lead) plastic semiconductor device with an opening in the package body for inserting a thermally conductive heat spreader and coupling it directly to a semiconductor die.

FIG. 5 is another embodiment substantially similar to the embodiment shown in FIG. 4, with one major difference. As illustrated in FIG. 5, a cross-section of a COL (Chip on Lead) semiconductor device 48 comprising a semiconductor die 50, having an active surface 52 and an inactive surface 54, mounted on a plurality of leads 56 of leadframe 58 is shown. Inactive surface 54 is attached to the plurality of leads 56 typically by double-sided polyimide tape or a thermally conductive epoxy. Wire bonds 60 are used to couple proximal ends of leads 56 to bonding pads (not shown) on the active surface 52 of semiconductor die 50. Encapsulant 62 forms the package body, encompassing an opening 64 to expose at least a portion of inactive surface 54. Again, it is possible to attach a heat sink in opening 64 to the exposed portion of inactive surface 54.

The foregoing description and illustrations contained herein demonstrate many of the advantages associated with the present invention. In particular, it has been revealed that mounting a semiconductor die on a window frame flag of a leadframe and molding a package body around the die, flag, and leadframe, wherein the package body includes a cavity exposing a portion of the inactive surface of the semiconductor die, increases the package's resistance to cracking during vapor phase or solder dip. Moreover, it is possible to insert a heat sink into the cavity of the package body and directly couple it to the semiconductor die to increase the heat dissipating effectiveness of the heat sink. Yet another advantages is that the present invention allows the heat sink to be attached at the user's site after the semiconductor device has already been board mounted, allowing the user increased flexibility in the type of heat sink to be used with the package.

Thus it is apparent that there has been provided, in accordance with the invention, a molded plastic semiconductor device with a reduced semiconductor die to flag material interface and an insertable heat sink that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, TAB tape can be used instead of a leadframe to support the semiconductor die. Furthermore, the invention is not limited to a specific heat spreader configuration, such as a heat sink with cooling fins. Any type of heat sink with an insertable portion can be accommodated in the present invention. Therefore, it is intended that this invention encompass all such variations and modifications as fall within the scope of the appended claims.

I claim:

1. The semiconductor device comprising:

a semiconductor die having an active surface, an inactive surface, and a periphery, wherein the semiconductor die has a plurality of bonding pads on the active surface;

a leadframe having a plurality of leads and a mounting surface with a die opening, the die opening being smaller than the semiconductor die, a first portion of the inactive surface of the semiconductor die being directly bonded to the mounting surface of the leadframe above the die opening thereby exposing a second portion of the inactive surface of the semiconductor die, whereby an interfacial area between the inactive surface of the semiconductor die and the mounting surface of the leadframe is limited to the first portion of the inactive surface;

a plurality of conductive wires electrically coupling the plurality of bonding pads on the active surface of the semiconductor die to the plurality of leads of the leadframe; and a molded package body around the periphery, over the active surface, and over the first portion of the inactive surface of the semiconductor die, the wires, and the leadframe, wherein the package body has an opening molded therein so that the second portion of the inactive surface of the semiconductor die remains uncovered, wherein said opening has a tapered sidewall to allow insertion of a heat spreader without external pressure.

2. The semiconductor device according to claim 1 wherein the leadframe comprises a leadframe having a surface treatment selected from a group consisting of: plating, organic coating, oxidation, and UV ozone cleaning.

3. The semiconductor device according to claim 1 further comprising an insertable thermally conductive heat spreader attached to the inactive surface of the semiconductor die through said opening in the package body wherein the heat spreader is not encapsulated by the encapsulant.

4. The semiconductor device according to claim 3 wherein the thermally conductive heat spreader is coupled to the inactive surface of the semiconductor die with an adhesive.

5. The semiconductor device according to claim 3 wherein the thermally conductive heat spreader is coupled to the inactive surface of the semiconductor die with a thermal grease.

6. A semiconductor device comprising:

a semiconductor die having an active surface, an inactive surface, and a periphery, wherein the semiconductor die has a plurality of bonding pads on the active surface;

a flagless leadframe having a plurality of leads, a number of the plurality of leads being directly mounted on the active surface of the semiconductor die and along the periphery thereof, the plurality of leads being selectively electrically coupled to the plurality of bonding pads on the active surface of the semiconductor die, and exposing the inactive surface of the semiconductor die; and a molded package body around the semiconductor die including the periphery and the active surface, and the leadframe, wherein the package body has an opening so that at least a substantial portion of the inactive surface of the semiconductor die remains uncovered, wherein said opening has a tapered sidewall to allow insertion of a heat spreader without external pressure.

7. The semiconductor device according to claim 6 wherein the leadframe comprises a leadframe having a surface treatment selected from a group consisting of: plating, organic coating, oxidation, and UV ozone cleaning.

8. The semiconductor device according to claim 6 further comprising an insertable thermally conductive heat spreader attached to the inactive surface of the semiconductor die through said opening in the package body wherein the heat spreader is not encapsulated by the encapsulant.

9. The semiconductor according to claim 8 wherein the thermally conductive heat spreader is coupled to the inactive surface of the semiconductor die with an adhesive.

10. The semiconductor device according to claim 8 wherein the thermally conductive heat spreader is coupled to the inactive surface of the semiconductor die with a thermal grease.

11. A semiconductor device comprising:

a semiconductor die having an active surface, an inactive surface, and a periphery, wherein the semiconductor die has a plurality of bonding pads on the active surface;

a flagless leadflame having a plurality of leads which are directly mounted on a first portion of the inactive surface of the semiconductor die and along the periphery thereof, the flagless leadframe exposing a second portion of the inactive surface of the semiconductor die, the plurality of leads selectively electrically coupled to the plurality of bonding pads on the active surface of the semiconductor die; and a molded package body around the semiconductor die including the periphery, the active surface, and the first portion of the inactive surface, and the leadframe, wherein the package body has an opening molded therein so that the second portion of the inactive surface of the semiconductor die remains uncovered, wherein said opening has a tapered sidewall to allow insertion of a heat spreader without external pressure.

12. The semiconductor device according to claim 11 wherein the leadframe comprises a leadframe having a surface treatment selected from a group consisting of: plating, organic coating, oxidation, and UV ozone cleaning.

13. The semiconductor device according to claim 11 further comprising an insertable thermally conductive heat spreader attached to the inactive surface of the semiconductor die through said opening in the package body wherein the heat spreader is not encapsulated by the encapsulant.

14. The semiconductor device according to claim 13 wherein the thermally conductive heat spreader is coupled to the inactive surface of the semiconductor die with an adhesive.

15. The semiconductor device according to claim 13 wherein the thermally conductive heat spreader is coupled to the inactive surface of the semiconductor die with a thermal grease.

16. A method of manufacturing a semiconductor device comprising the steps of:

providing a semiconductor die having an active surface, an inactive surface, and a periphery;

providing a leadframe having an integral die mounting area and a plurality of leads;

mounting the semiconductor die directly onto the die mounting area wherein the die mounting area intimately supports a first portion of the inactive surface around the periphery of the semiconductor die, exposing a second portion of the inactive surface of the semiconductor die, whereby an interfacial area between the inactive surface of the semiconductor die and the mounting surface of the leadframe is limited to the first portion of the inactive surface;

electrically coupling the semiconductor die to the plurality of leads of the leadframe; and molding a package body around the periphery, over the active surface, and over the first portion of the inactive surface of the semiconductor die, and the leadframe, with means for forming an opening in the package body during molding so that the second portion of the inactive surface of the semiconductor die remains uncovered, wherein said opening has tapered sidewalls to allow insertion of a heat spreader without external pressure.

17. The method of manufacturing a semiconductor device according to claim 16 wherein the step of providing a leadframe further comprises performing a leadframe surface treatment selected from a group consisting of: plating, organic coating, oxidation, and UV ozone cleaning.

18. The method of manufacturing a semiconductor device according to claim 16 further comprising the step of attaching a thermally conductive heat spreader to the inactive surface of the semiconductor die through said opening in the package body after the step of molding, wherein the heat spreader is not encapsulated by the encapsulant.

19. The method of manufacturing a semiconductor device according to claim 18 wherein the step of attaching a thermally conductive heat spreader to the inactive surface of the semiconductor die comprises applying an adhesive for coupling the heat spreader to the inactive surface.

20. The method of manufacturing a semiconductor device according to claim 18 wherein the step of attaching a thermally conductive heat spreader to the inactive surface of the semiconductor die comprises applying a thermal grease between the heat spreader and the inactive surface.

* * * * *